US012712161B2

(12) United States Patent
Li et al.

(10) Patent No.: US 12,712,161 B2
(45) Date of Patent: Aug. 18, 2026

(54) BIPOLAR ELECTROSTATIC CHUCK ELECTRODE DESIGNS

(71) Applicant: Applied Materials, Inc., Santa Clara, CA (US)

(72) Inventors: Jian Li, Fremont, CA (US); Kallol Bera, Fremont, CA (US); Edward P. Hammond, Hillsborough, CA (US); Dmitry A. Dzilno, Sunnyvale, CA (US); Juan Carlos Rocha-Alvarez, San Carlos, CA (US); Xiaopu Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 370 days.

(21) Appl. No.: 18/158,379

(22) Filed: Jan. 23, 2023

(65) Prior Publication Data

US 2024/0249924 A1 Jul. 25, 2024

(51) Int. Cl.
*H01J 37/32* (2006.01)
*C23C 16/458* (2006.01)
*H10P 72/72* (2026.01)

(52) U.S. Cl.
CPC .... *H01J 37/32724* (2013.01); *C23C 16/4586* (2013.01); *H01J 37/32082* (2013.01);
(Continued)

(58) Field of Classification Search
CPC ........... H01J 37/32724; H01J 37/32082; H01J 37/32541; H01J 37/32568;
(Continued)

(56) References Cited

U.S. PATENT DOCUMENTS 5,151,845 A * 9/1992 Watanabe ............. H10P 72/722 279/128
5,822,171 A * 10/1998 Shamouilian ..... C23C 16/45521 279/128

(Continued)

FOREIGN PATENT DOCUMENTS

JP 10223742 A 8/1998
JP H1187478 A 3/1999

(Continued)

OTHER PUBLICATIONS

Korean Application No. 10-2025-7027434, Office Action mailed on Jan. 31, 2026, 15 pages (7 pages of original document and 8 pages of English Translation).

(Continued)

*Primary Examiner* — Thienvu V Tran
*Assistant Examiner* — Muaamar Qahtan Al-Taweel
(74) *Attorney, Agent, or Firm* — Kilpatrick Townsend & Stockton LLP

(57) ABSTRACT

Exemplary substrate support assemblies may include an electrostatic chuck body defining a substrate support surface that defines a substrate seat. The assemblies may include a support stem coupled with the electrostatic chuck body. The assemblies may include a first bipolar electrode embedded within the electrostatic chuck body. The assemblies may include a second bipolar electrode embedded within the electrostatic chuck body. An entirety of the second bipolar electrode may be radially inward of at least a portion of the first bipolar electrode. The first bipolar electrode and the second bipolar electrode may be coaxial with one another. Each of the first bipolar electrode and the second bipolar electrode may be coupled with at least one RF power supply. Each of the first bipolar electrode and the second bipolar (Continued)

electrode may be coupled with at least one DC power supply.

13 Claims, 10 Drawing Sheets

(52) U.S. Cl.
CPC .. *H01J 37/32541* (2013.01); *H01J 37/32568* (2013.01); *H01J 37/32577* (2013.01); *H10P 72/722* (2026.01); *H01J 2237/2007* (2013.01); *H01J 2237/332* (2013.01)

(58) Field of Classification Search
CPC ......... H01J 37/32577; H01J 2237/2007; H01J 2237/332; H01J 37/32715; C23C 16/4586; H01L 21/6833; H01L 21/6831; H01L 361/234; H01L 21/686
See application file for complete search history.

(56) References Cited

U.S. PATENT DOCUMENTS

| | | | | |
|---|---|---|---|---|
| 5,880,922 | A * | 3/1999 | Husain | H01L 21/6831 279/128 |
| 5,886,866 | A * | 3/1999 | Hausmann | H01L 21/6833 279/128 |
| 7,283,346 | B2 * | 10/2007 | Yoshida | H01L 21/6833 361/230 |
| 8,238,072 | B2 * | 8/2012 | Fujisawa | H02N 13/00 361/234 |
| 11,289,355 | B2 * | 3/2022 | Gomm | H01L 21/6833 |
| 2005/0034674 | A1 * | 2/2005 | Ono | H10P 72/722 118/728 |
| 2006/0102595 | A1 * | 5/2006 | Inoue | H10P 72/7624 219/50 |
| 2011/0096461 | A1 * | 4/2011 | Yoshikawa | H10P 72/722 361/234 |
| 2016/0333475 | A1 * | 11/2016 | Gomm | C23C 16/4586 |
| 2021/0166915 | A1 | 6/2021 | Hammond et al. | |
| 2021/0210370 | A1 | 7/2021 | Hwang et al. | |
| 2022/0122875 | A1 | 4/2022 | Li et al. | |

FOREIGN PATENT DOCUMENTS

| | | | |
|---|---|---|---|
| KR | 101415551 | B1 | 7/2014 |
| KR | 20190109496 | A | 9/2019 |
| KR | 20200014881 | A | 2/2020 |
| KR | 20230084586 | A | 6/2023 |
| WO | 2022086724 | A1 | 4/2022 |

OTHER PUBLICATIONS

Application No. PCT/US2024/011864 , International Search Report and Written Opinion, Mailed On May 7, 2024, 10 pages.

* cited by examiner

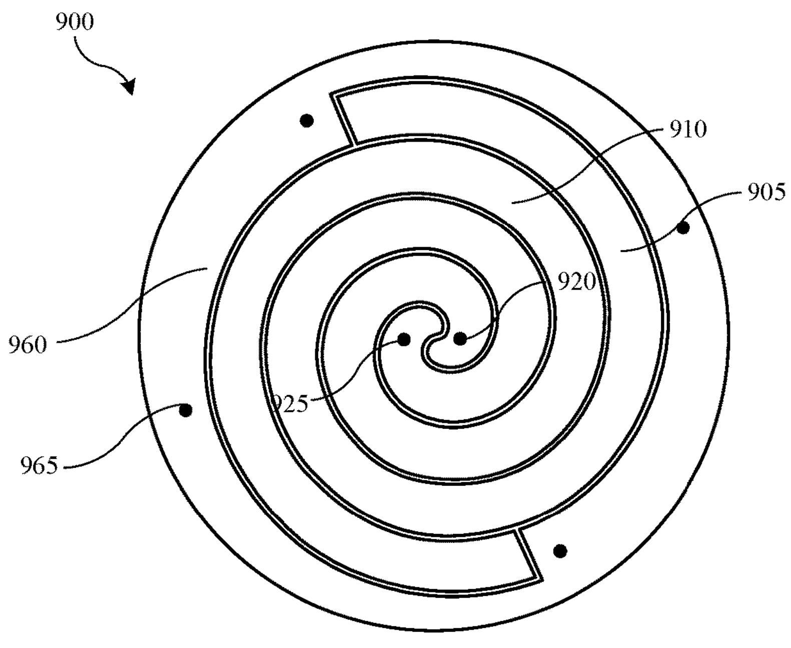
FIG. 9
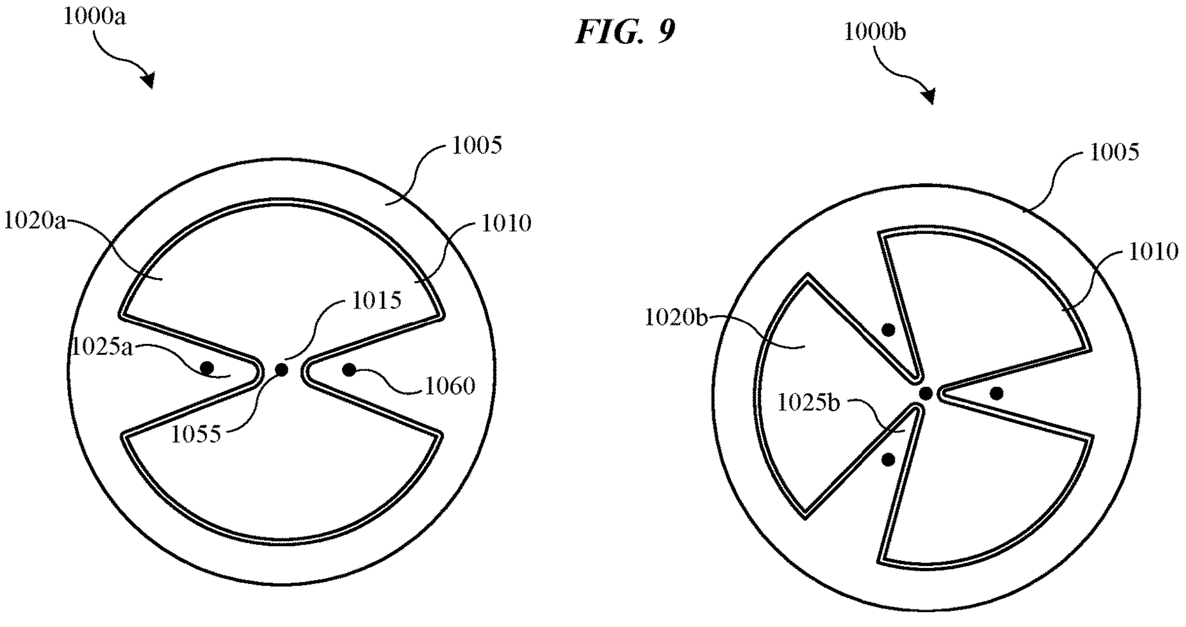
FIG. 10A
FIG. 10B

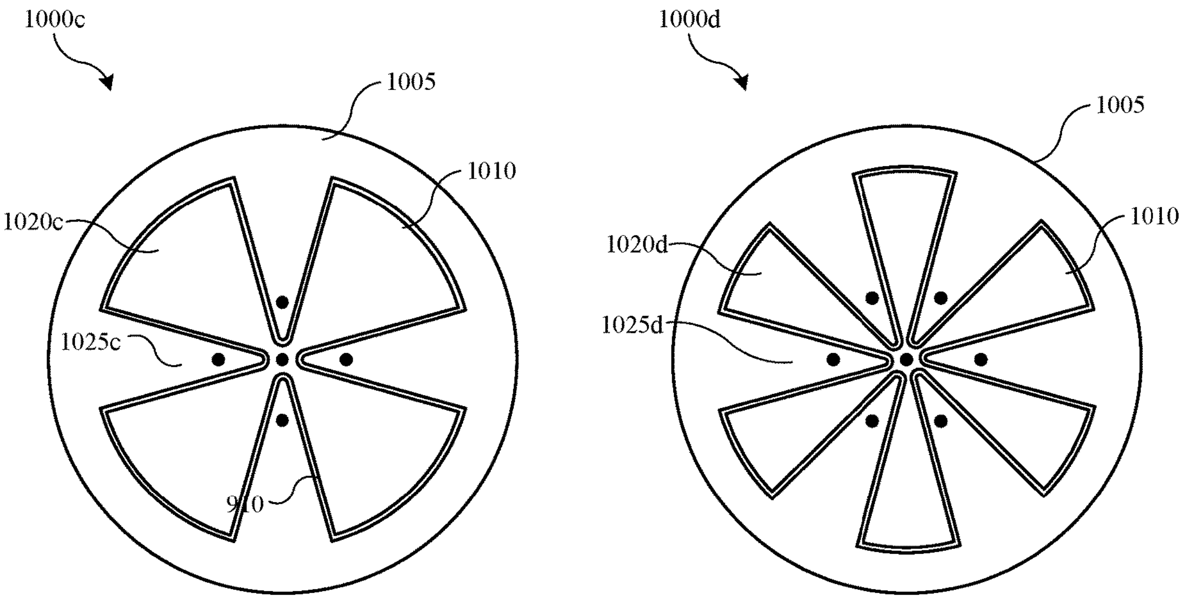
*FIG. 10C*
*FIG. 10D*
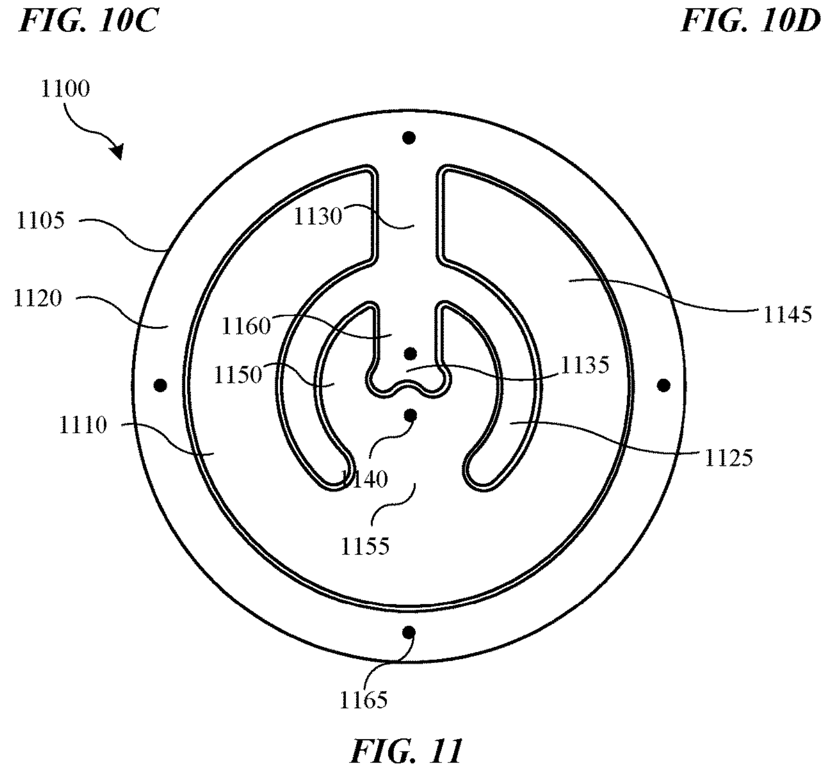
*FIG. 11*

BIPOLAR ELECTROSTATIC CHUCK ELECTRODE DESIGNS

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. For example, higher temperatures may lead to higher deposition rates. Therefore, ay temperature non-uniformity across the substrate support may result in film thickness uniformity issues on the wafer. Thus, there is a need for improved systems and methods that can be used to maintain uniform temperatures across the substrate support to produce high quality devices and structures. These and other needs are addressed by the present technology.

SUMMARY

Exemplary substrate support assemblies may include an electrostatic chuck body defining a substrate support surface that defines a substrate seat. The assemblies may include a support stem coupled with the electrostatic chuck body. The assemblies may include a first bipolar electrode embedded within the electrostatic chuck body. The assemblies may include a second bipolar electrode embedded within the electrostatic chuck body. An entirety of the second bipolar electrode may be radially inward of at least a portion of the first bipolar electrode. The first bipolar electrode and the second bipolar electrode may be coaxial with one another. Each of the first bipolar electrode and the second bipolar electrode may be coupled with at least one RF power supply. Each of the first bipolar electrode and the second bipolar electrode may be coupled with at least one DC power supply.

In some embodiments, the assemblies may include an annular electrode disposed about the first bipolar electrode. The annular electrode may be DC floated and RF powered. The assemblies may include a spoked connector disposed within the electrostatic chuck body. The spoked connector may couple the annular electrode with an RF power supply. Individual spokes of the spoked connector may have a width of at least 5 mm. The first bipolar electrode and the second bipolar electrode may have substantially the same area. The first electrode may have a generally annular shape. The second electrode may have a generally circular shape. The assemblies may include an annular electrode disposed about the first bipolar electrode. The annular electrode may be DC floated and RF powered. The annular electrode may be coaxial with the first bipolar electrode. The second electrode may include a first portion and a second portion that are coupled with one another and separated by a gap. A portion of first electrode may extend into the gap formed between the first portion and the second portion.

Some embodiments of the present technology may encompass substrate support assemblies that may include an electrostatic chuck body defining a substrate support surface that defines a substrate seat. The assemblies may include a support stem coupled with the electrostatic chuck body. The assemblies may include a first bipolar electrode embedded within the electrostatic chuck body. The assemblies may include a second bipolar electrode embedded within the electrostatic chuck body. Central axes of the first bipolar electrode and the second bipolar electrode may be radially offset from one another. Each of the first bipolar electrode and the second bipolar electrode may be coupled with at least one RF power supply. Each of the first bipolar electrode and the second bipolar electrode may be coupled with at least one DC power supply. The assemblies may include an RF powered electrode having an outer periphery that extends beyond peripheral edges of the first bipolar electrode and the second bipolar electrode. The assemblies may include a spoked connector disposed within the electrostatic chuck body. The spoked connector may couple the RF powered electrode with an RF power supply.

In some embodiments, each of the first bipolar electrode and the second bipolar electrode may be generally semicircular in shape. Each of the first bipolar electrode and the second bipolar electrode may include a wedge shape of less than 180 degrees of a circle. The assemblies may include a third bipolar electrode having a wedge shape. The assemblies may include a fourth bipolar electrode having a wedge shape. A polarity of the bipolar electrodes may alternate for adjacent ones of the bipolar electrodes. A number of bipolar electrodes having wedge shapes may be even.

Some embodiments of the present technology may encompass substrate support assemblies that may include an electrostatic chuck body defining a substrate support surface that defines a substrate seat. The assemblies may include a support stem coupled with the electrostatic chuck body. The assemblies may include a first bipolar electrode embedded within the electrostatic chuck body. The assemblies may include a second bipolar electrode embedded within the electrostatic chuck body. The second electrode may include a first portion and a second portion that are coupled with one another and separated by a gap. A portion of first electrode may extend into the gap formed between the first portion and the second portion. Each of the first bipolar electrode and the second bipolar electrode may be coupled with at least one RF power supply. Each of the first bipolar electrode and the second bipolar electrode may be coupled with at least one DC power supply.

In some embodiments, an entirety of the second bipolar electrode may be radially inward of at least a portion of the first bipolar electrode. The assemblies may include an annular electrode disposed about the first bipolar electrode and the second bipolar electrode. The annular electrode may be DC floated and RF powered. The first bipolar electrode may include a first outer portion and a first inner portion that are coupled via a first neck. The second bipolar electrode may include a second outer portion and a second inner portion that are coupled via a second neck. The second outer portion may be interdigitated between the first outer portion and the first inner portion. A thickness of each of the first neck and the second neck may be at least 1.5× a width of a smaller of the first inner portion and the first outer portion. Each of the first bipolar electrode and the second bipolar electrode may include a spiral shape. A width of each segment of the spiral shape may be at least 20 mm.

Such technology may provide numerous benefits over conventional systems and techniques. For example, embodiments of the present technology may provide substrate supports that may provide more uniform flow of current across chucking electrodes, which may help reduce hotspots attributed to higher resistive heating. This may help improve the temperature uniformity across the substrate support and subsequently improve the film thickness uniformity on wafer. Additionally, the substrate supports may maintain bipolar chucking while supporting RF modulation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 9 shows a schematic top plan view of an electrode arrangement for an exemplary substrate support assembly according to some embodiments of the present technology.

FIG. 10A shows a schematic top plan view of an electrode arrangement for an exemplary substrate support assembly according to some embodiments of the present technology.

FIG. 10B shows a schematic top plan view of an electrode arrangement for an exemplary substrate support assembly according to some embodiments of the present technology.

FIG. 10C shows a schematic top plan view of an electrode arrangement for an exemplary substrate support assembly according to some embodiments of the present technology.

FIG. 10D shows a schematic top plan view of an electrode arrangement for an exemplary substrate support assembly according to some embodiments of the present technology.

FIG. 11 shows a schematic top plan view of an electrode arrangement for an exemplary substrate support assembly according to some embodiments of the present technology.

Figure 1:
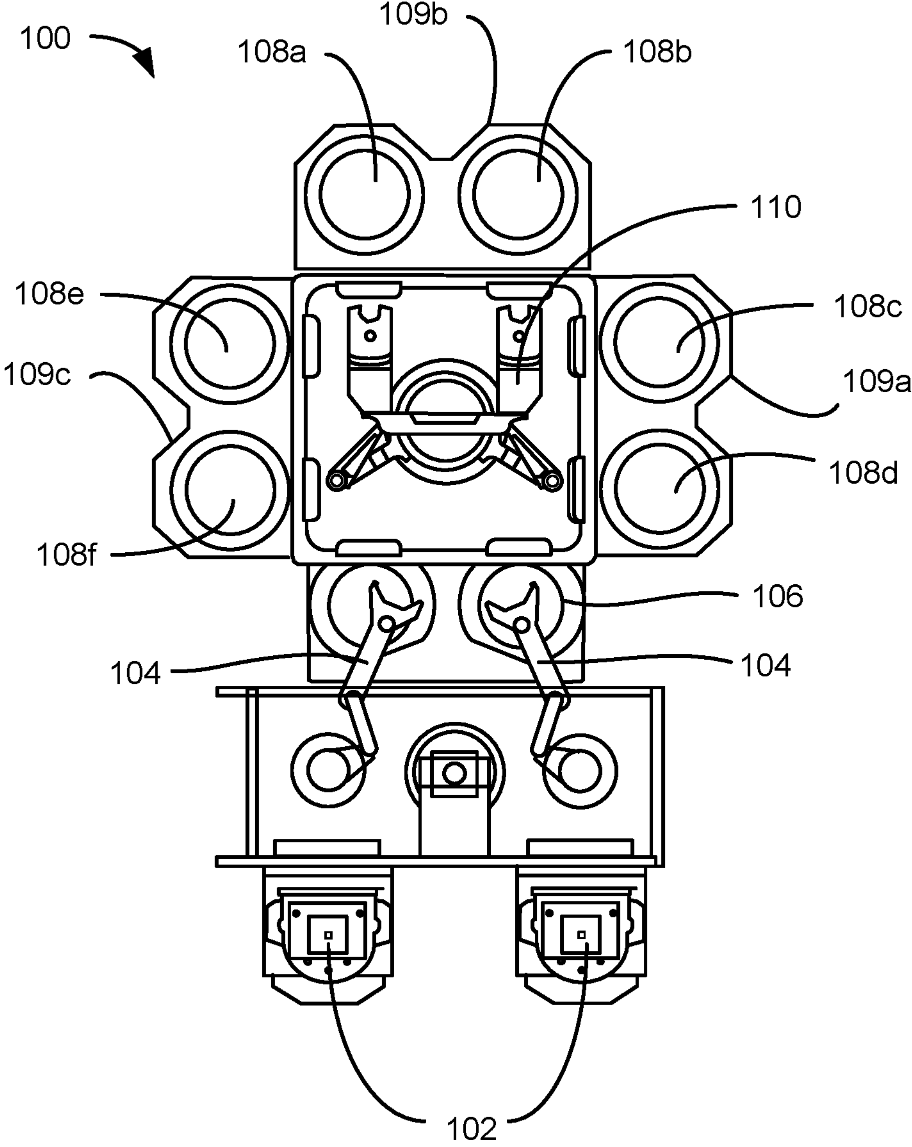
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. These formed films may be produced under conditions that cause stresses on the substrate. An electrostatic chuck may be used to produce a clamping action against the substrate to overcome the bowing stress. However, as semiconductor processing continues to increase precision and reduce device sizes, chucking may participate in issues with processing. For example, uneven current flow, particularly at narrow portions of an electrode through which much of the current passes, may generate temperature non-uniformities (e.g., hot spots) across the substrate support. These hot spots may cause high deposition rates proximate such regions, which may create film non-uniformity issues on wafer. Additionally, conventional bipolar electrode designs used for chucking, such as two semicircular electrodes that extend to or beyond the wafer edge, may cause undesired generation of DC plasma, electrical discharge (e.g., arcing), and/or may discolor the substrate support, particularly on a side of the positive DC charge.

The present technology overcomes these challenges with substrate support assemblies having bipolar chucking capabilities and may include electrode configurations that prevent the concentration of current that may otherwise increase the resistive heating and create hot spots on the substrate support surface. Additionally, the present technology may implement RF electrode configurations that reduce issues associated with DC currents (and in particular opposing DC currents) being present radially outward of a wafer. The RF electrode configurations may facilitate more uniform RF fields and subsequently more uniform plasma deposition across the wafer, including edge regions of the wafer, while also reducing undesired generation of DC plasma, electrical discharge (e.g., arcing), and/or may discolor the substrate support.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
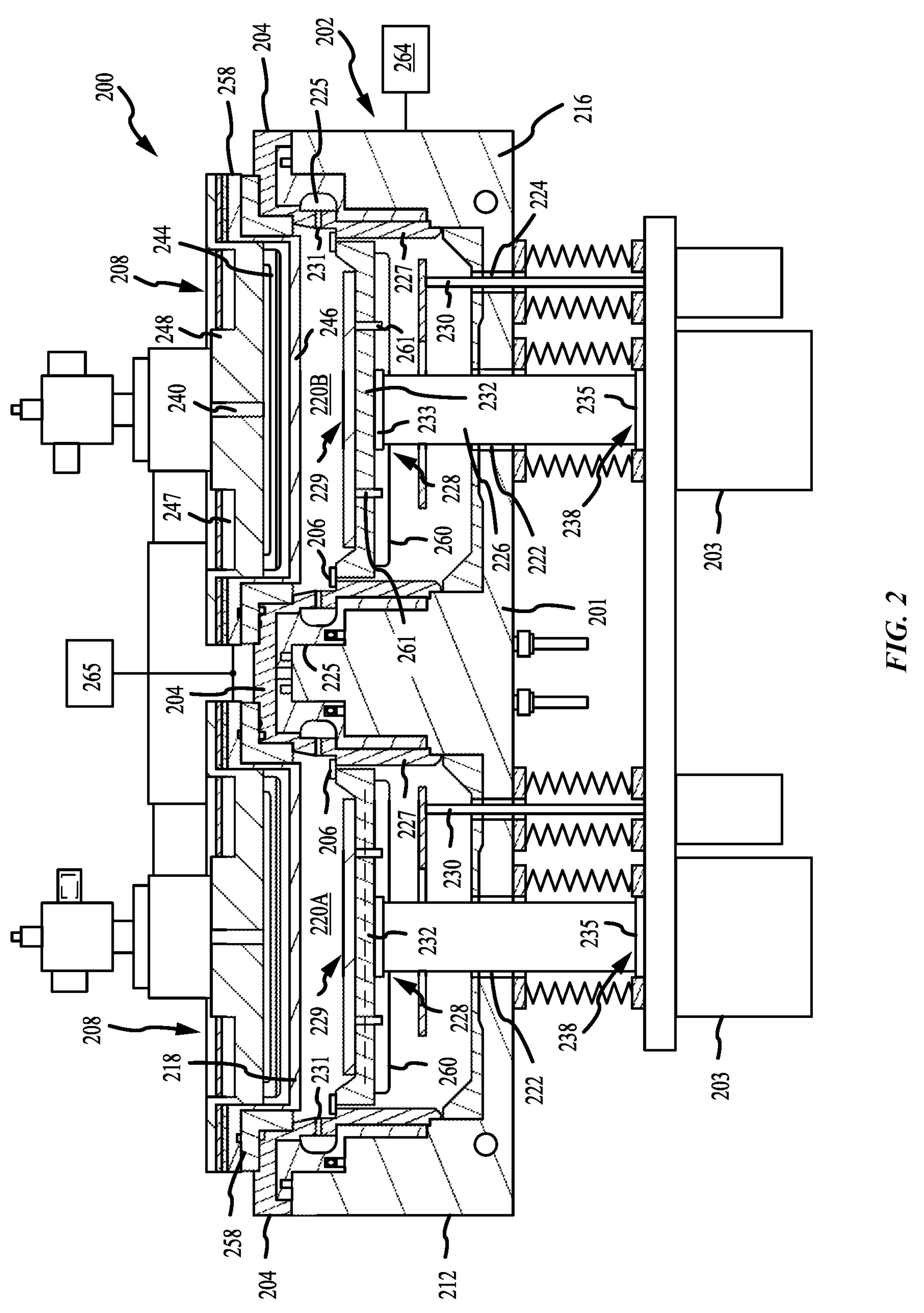
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
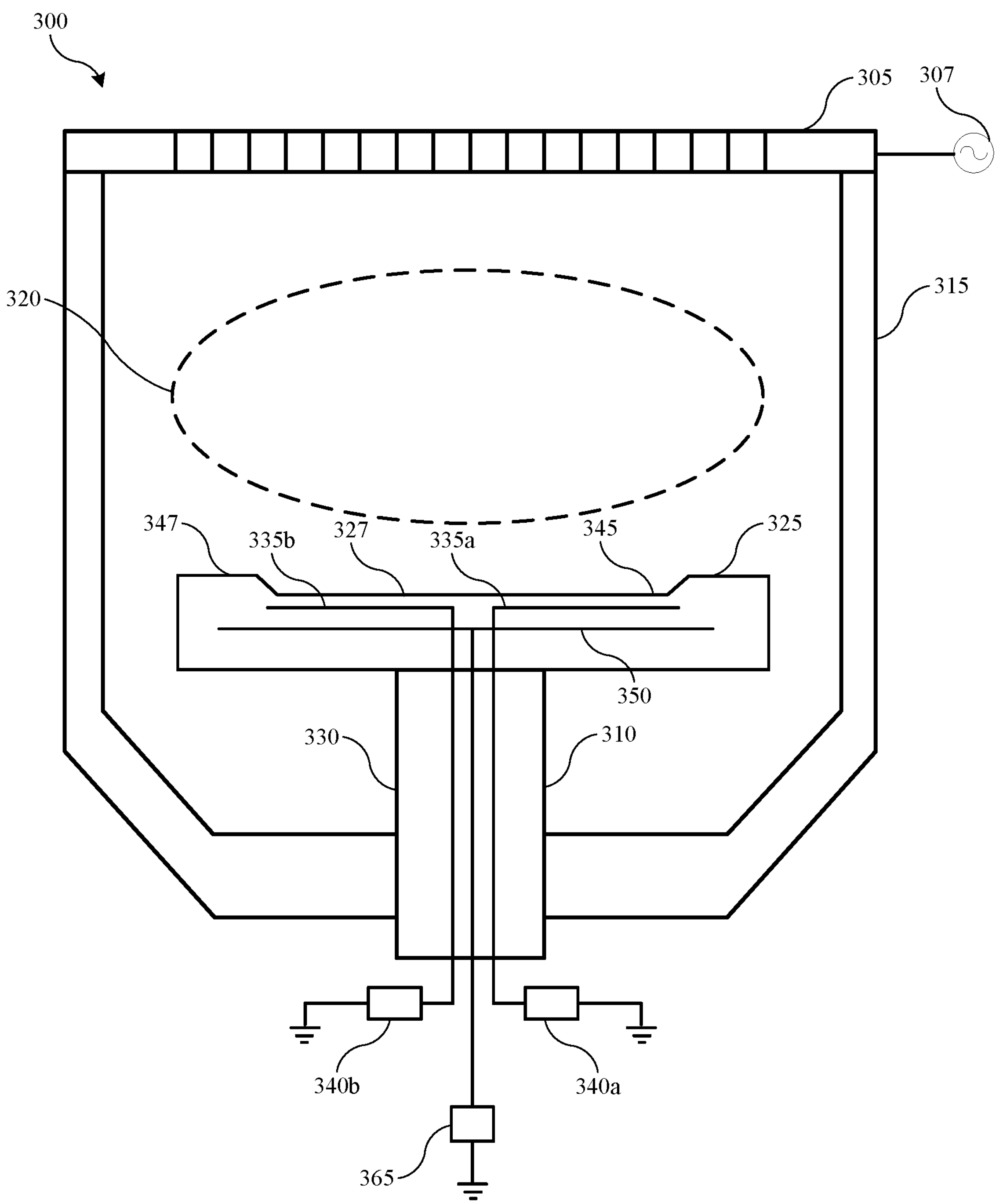
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include a first bipolar electrode 335*a*, which may be embedded within the chuck body proximate the substrate support surface. Electrode 335*a* may be electrically coupled with a DC power source 340*a*. Power source 340*a* may be configured to provide energy or voltage to the electrically conductive chuck electrode 335*a*. This may be operated to form a plasma of a precursor within the processing region 320 of the semiconductor processing chamber 300, although other plasma operations may similarly be sustained. For example, electrode 335*a* may also be a chucking mesh that operates as electrical ground for a capacitive plasma system including an RF source 307 electrically coupled with showerhead 305. For example, electrode 335*a* may operate as a ground path for RF power from the RF source 307, while also operating as an electric bias to the substrate to provide electrostatic clamping of the substrate to the substrate support surface. Power source 340*a* may include a filter, a power supply, and a number of other electrical components configured to provide a chucking voltage.

The electrostatic chuck body may also include a second bipolar electrode 335*b*, which may also be embedded within the chuck body proximate the substrate support surface. Electrode 335*b* may be electrically coupled with a DC power source 340*b*. Power source 340*b* may be configured to provide energy or voltage to the electrically conductive chuck electrode 335*b*. Additionally electrical components and details about bipolar chucks according to some embodiments will be described further below, and any of the designs may be implemented with processing chamber 300. For example, additional plasma related power supplies or components may be incorporated as will be explained further below.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340*a* and 340*b* may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Figure 4A:
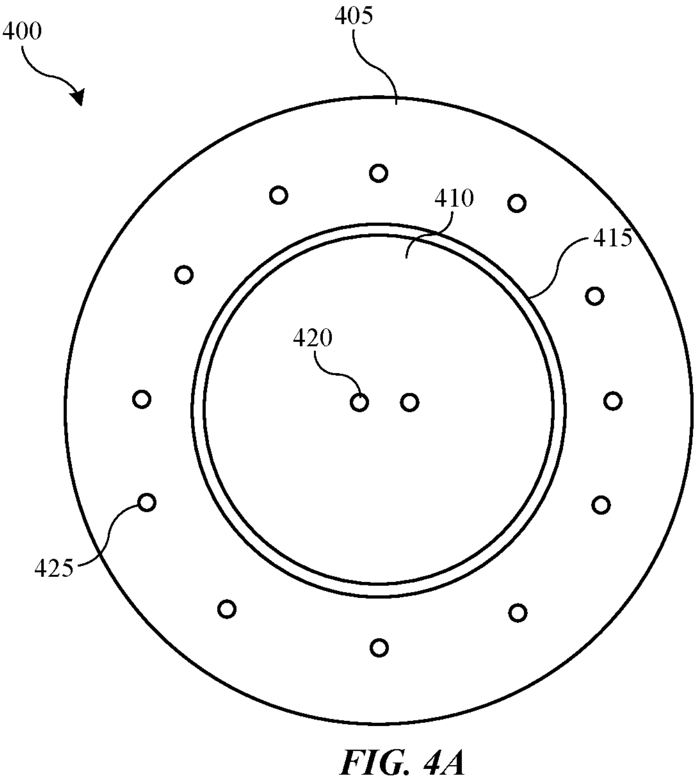
FIG. 4A shows a schematic top plan view of an electrode arrangement for an exemplary substrate support assembly according to some embodiments of the present technology.

FIG. 4A shows a schematic top view of an electrode arrangement 400 for an exemplary substrate support assembly according to some embodiments of the present technology. Electrodes in arrangement 400 may be any of the electrodes previously described, such as may be included in substrate support assembly 310, or any other number of pedestals or chucks. The electrodes may be operable as an electrostatic chuck as discussed above, and as will be further described below. As illustrated, electrode arrangement 400 may include a first bipolar electrode 405, and a second bipolar electrode 410. The bipolar electrodes may be embedded in a puck or chuck body as described above, such as a ceramic including aluminum nitride, and may be characterized by any of the features, configurations, or characteristics as discussed above for any substrate support. In some embodiments, the bipolar electrodes 405, 410 may be embedded between a heater 455 (shown in FIG. 4B) and a substrate support surface, however other embodiments may position the bipolar electrodes 405, 410 at other locations relative to the heater or omit the heater entirely.

First bipolar electrode 405 and second bipolar electrode 410 may each include a mesh material that may be substantially coplanar across both electrodes within the electrostatic chuck. The mesh materials may be characterized by any number of shapes or geometries. As illustrated, the first bipolar electrode 405 has a generally annular shape and extends about a generally circular second bipolar electrode 410, however other shapes such as rectangles, or any other shape may be used, which may be at least in part determined from substrate geometries, for example. The entirety of the second bipolar electrode 410 may be radially inward of the first bipolar electrode 405. In other words, the first bipolar electrode 405 may completely surround the second bipolar electrode 410. In some embodiments, the two bipolar electrodes 405, 410 may be coaxial with one another. The second bipolar electrode 410 may have a diameter of between about 7 inches and 12 inches, between about 8 inches and 11 inches, or between about 9 inches and 10 inches, although other diameters are possible in some embodiments. The first bipolar electrode 405 may have an outer diameter of between about 12 inches and 14 inches, between about 12.25 inches and 13.75 inches, between about 12.5 inches and 13.5 inches, or between 12.75 inches and 12.25 inches. For example, the mesh the first bipolar electrode 405 may have an outer periphery that extends radially outward beyond an outer periphery of a substrate seat (which may match an outer periphery of a substrate being processed and may be formed from a recessed region, similar to recessed region 345) defined by the substrate support surface. The first bipolar electrode 405 and second bipolar electrode 410 may be spaced apart by a gap 415. The gap 415 may be between about 1 mm and 5 mm, between about 2 mm and 4 mm, or about 3 mm in some embodiments.

Electrode leads may couple one or more power sources with the mesh of each of the first bipolar electrode 405 and the second bipolar electrode 410. For example, the second bipolar electrode 410 may be coupled with one or more power sources at one or more positions 420 that may be proximate a center of the second bipolar electrode 410 or at any other position along the mesh in some embodiments. The first bipolar electrode 405 may be coupled with one or more power sources at one or more positions about the circumference of the first bipolar electrode 405. For example, as illustrated the first bipolar electrode 405 may be coupled with power sources at a number of positions 425 that are spaced at even angular intervals about the first bipolar electrode 405. In other embodiments, one or more positions 425 may be positioned at irregular intervals about the first bipolar electrode 405. The first bipolar electrode 405 may include any number of positions 425. For example, the first bipolar electrode 405 may include one or more positions, two or more positions, three or more positions, four or more positions, five or more positions, six or more positions, seven or more positions, eight or more positions, nine or more positions, ten or more positions, eleven or more positions, twelve or more positions, or more.

In some embodiments, to facilitate the coupling between the first bipolar electrode 405 and the one or more power sources, the chuck body may include a spoked connector 430 that is embedded within and/or otherwise disposed within the electrostatic chuck body. For example, the spoked connector 430 may be embedded within the chuck body between the substrate support surface and the heater. A power coupling may extend through a stem or shaft of the chuck body and couple with a hub 435 of the spoked connector 430 and a number of conductive elements 450 may couple with the first bipolar electrode 405. As best illustrated in FIG. 4C, the spoked connector 430 may include a number of spokes 440 that extend radially outward from the hub 435. Each spoke 440 may extend radially outward a sufficient distance such that an outer end of each spoke 440 may be positioned underneath a portion of the first bipolar electrode 405. In some embodiments, each spoke 440 may extend to and couple with a rim 445 that is disposed beneath the first bipolar electrode 405. The outer ends of the spokes 440 and/or the rim 445 may include a number of conductive elements 450, such as pins, straps, and/or other connective elements that may extend upward and couple with the first bipolar electrode 405 at positions 425 to electrically couple the first bipolar electrode 405 with the one or more power sources. In some embodiments, the outer ends/rim 445 of spoked connector 430 may have a same outer diameter as the first bipolar electrode 405, while in other embodiments, the outer diameter of the outer ends/rim 445 may be greater than or less than a diameter of the first bipolar electrode 405, with a portion of the rim 445 being directly under the first bipolar electrode 405. In some embodiments, the hub 435 may have a diameter of between about 0.5 inches and 3.5 inches, between or about 1 inch and 3 inches, or between or about 1.5 inches and 2.5 inches. In some embodiments, one or more of the leads that couple with the positions 420 of the second bipolar electrode 410 may extend through the hub 435. For example, the hub 435 may define one or more apertures through a thickness of the hub 435 that enable leads, rodes, and/or other electrical connectors to pass through the hub 435 to couple with the second bipolar electrode 410.

The spoked connector 430 may include any number of spokes 440. For example, in some embodiments the spoked connector 430 may include three or more spokes, four or more spokes, five or more spokes, six or more spokes, seven or more spokes, eight or more spokes, or more. In some embodiments, a number of spokes 440 may match a number of conductive elements 450 and/or positions 425, while in other embodiments there may be a greater or lesser number of spokes 440 than conductive elements 450 and/or positions 425. In some embodiments, each spoke 440 may have a constant width from the hub 435 to the outer end/rim 445. In other embodiments, a width of each spoke 440 may vary along a length of the spoke 440. For example, each spoke 440 may be more narrow proximate the hub 435 and taper to a wider portion proximate the outer end/rim 445. In some embodiments, a width (or minimum width) of each spoke 440 may be at least 5 mm, such as between about 5 mm and 40 mm, between about 10 mm and 35 mm, between about 15 mm and 30 mm, or between about 20 mm and 25 mm, although wider spokes (e.g., spokes with widths of greater than 40 mm, greater than 45 mm, greater than 50 mm, greater than 60 mm, greater than 70 mm, greater than 80 mm, greater than 90 mm, greater than 100 mm, or more) may be possible in some embodiments. As a number of the spokes increases, a width of each spoke may decrease, as the amount of current being distributed through each spoke is divided amongst additional spokes and may reduce the likelihood of resistive heating hot spots due to high current loads at a given location. In embodiments in which the spokes 440 taper outward from the hub 435, the outer ends of each spoke 440 may be between about 1.5 and 10 times wider than an inner end of the spoke 440, between about 2 and 8 times, between about 2.5 and 7 times, between 3 and 6 times, or between 4 and 5 times wider than an inner end of the spoke 440.

In some embodiments, the spoked connector 430 (e.g., the hub 435, spokes 440, and/or rim 445) may be positioned below first bipolar electrode 405 and/or the second bipolar electrode 410 by a distance of between about 1 mm and 10 mm, between about 2 mm and 9 mm, between about 3 mm and 8 mm, between about 4 mm and 7 mm, or between about 5 mm and 6 mm. In some embodiments, the heater 455 may be spaced apart (e.g., below) from the spoked connector 430 by between about 1 mm and 15 mm, between about 2 mm and 13 mm, between about 3 mm and 11 mm, between about 4 mm and 9 mm, or between or about 5 mm and 7 mm. Smaller distances than these ranges may result in too much RF and/or DC current leakage, while larger distances may result in needing larger/more powerful heaters, which increase costs and power usage.

Figure 4B:
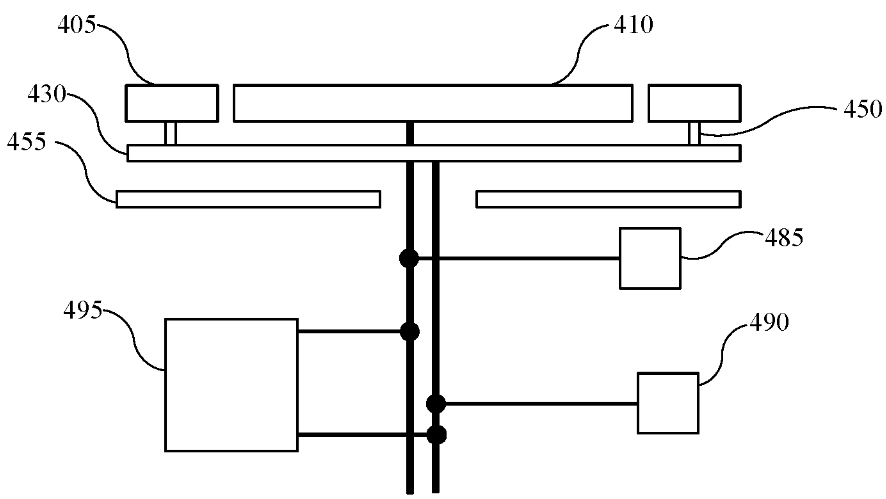
FIG. 4B shows a schematic partial cross-sectional view of an electrode arrangement for an exemplary substrate support assembly according to some embodiments of the present technology.
Figure 4C:
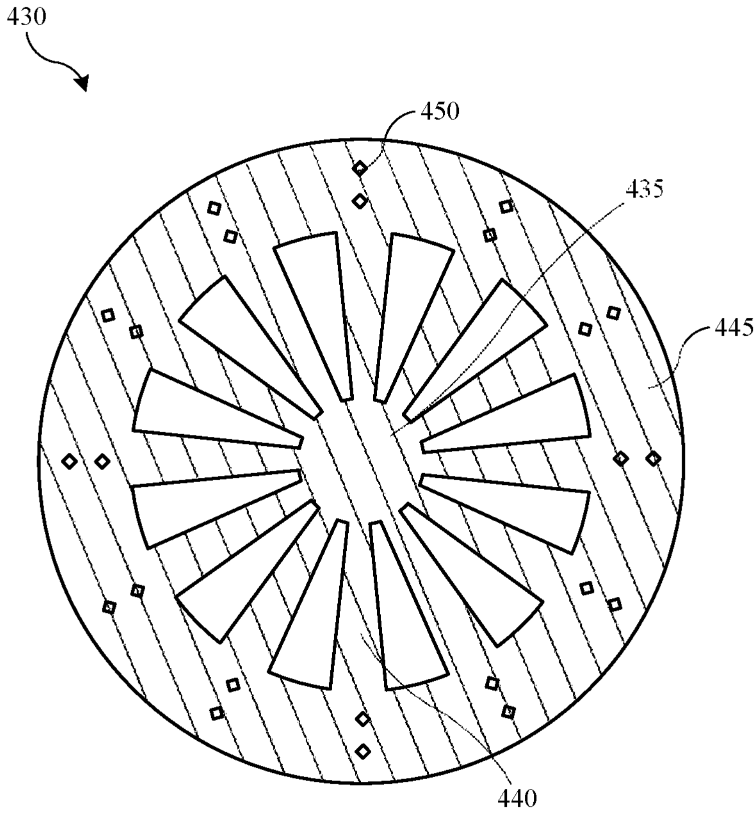
FIG. 4C shows a schematic top plan view of a spoked connector for an exemplary substrate support assembly according to some embodiments of the present technology.

Each of the electrodes may be coupled with one or more power supplies as can be seen in FIG. 4B. FIG. 4B shows a schematic partial cross-sectional view of electrode arrangement 400 for an exemplary substrate support assembly according to some embodiments of the present technology. As shown, the arrangement 400 may include the first bipolar electrode 405 and second bipolar electrode 410. Each bipolar electrode may be coupled with one or more power supplies as previously described, and FIG. 4B illustrates an exemplary coupling arrangement, although it is to be understood that any number of electrode coupling configurations may be used. For example, the first bipolar electrode 405 may be coupled with a first DC power supply 485 (such as via spoked connector 430), and the second bipolar electrode 410 may be coupled with a second DC power supply 490 (such as via a DC rod or lead that extends up to the second bipolar electrode 410). Either power supply may be operated in a positive or negative voltage arrangement. This may enable the two bipolar electrodes to be operated with opposite polarities to chuck a wafer. For example, the first bipolar electrode 405 may be supplied with a negative current, while the second bipolar electrode 410 may be supplied with a positive current of equal magnitude, or vice versa. In some embodiments, the polarity of current supplied to each bipolar electrode may be switched during processing, for example, as well as increased or decreased in either direction to provide electrostatic chucking. Each power supply may be floating (ungrounded), which eliminates a relative voltage differential between the electrodes and chamber surroundings, such as chamber sidewalls. One or more RF power supplies may also be incorporated in some embodiments. For example, an RF power supply 495 may be coupled with the first bipolar electrode 405 (such as via the spoked connector 430 or another spoked connector) and the second bipolar electrode 410 (such as via an RF rod that extends up to the second bipolar electrode 410). Although a separate RF power supply may be coupled with each of the bipolar electrodes, as will be described below, in some embodiments a single power supply may be used based on the configuration of the electrodes. Regardless of whether a single power supply or multiple power supplies are coupled with the bipolar electrodes 405, 410, the circuitry coupled between the respective bipolar electrode and the respective power source may be the same or different for each bipolar electrode 405, 410. For example, the circuitry may include one or more components, such as capacitors, that enable the amount of current supplied to each of the bipolar electrodes 405, 410 to be independently controlled, which may enable the current supplied to each bipolar electrode to be used as a tuning knob to further adjust RF power (and/or clamping force), which may enable the current to each bipolar electrode to tune the deposition rate at a given portion of the substrate.

In operation, by using meshes that extend radially beyond the edges of the substrate seat and wafer, RF flow may be delivered more uniformly across the wafer, including edge regions of the wafer. This facilitates more uniform plasma deposition across the wafer. In some embodiments, the first bipolar electrode 405 and the second bipolar electrode 410 may have substantially (e.g., within 10%, within 5%, within 3%, within 1%, or less) the same area.

Figure 5A:
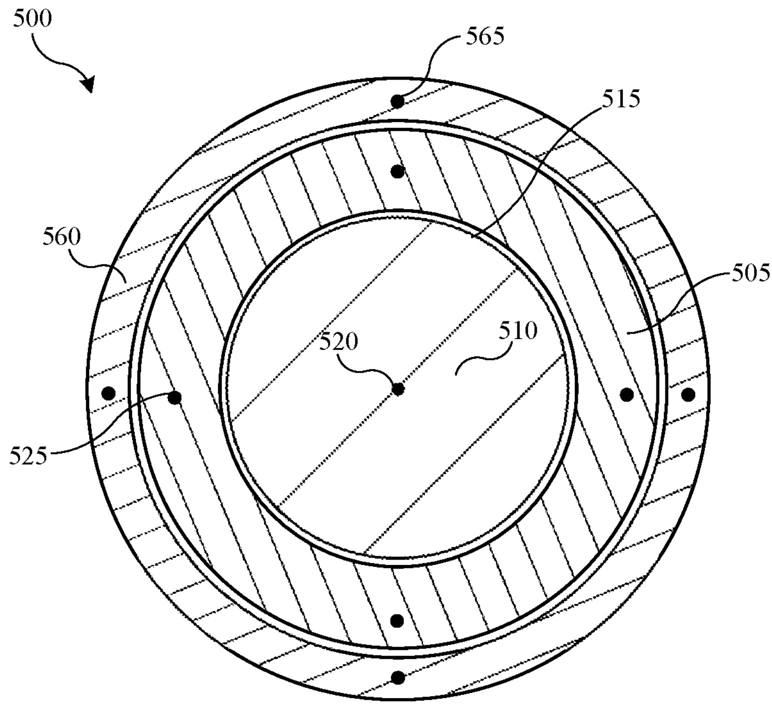
FIG. 5A shows a schematic top plan view of an electrode arrangement for an exemplary substrate support assembly according to some embodiments of the present technology.

The present technology may similarly encompass other bipolar chuck configurations that can be incorporated within any of the substrate supports as previously described. FIG. 5A shows a schematic top view of an electrode arrangement 500 for an exemplary substrate support assembly according to some embodiments of the present technology. Electrodes in arrangement 500 may be any of the electrodes previously described, such as may be included in substrate support assembly 310, or any other number of pedestals or chucks. The electrodes may be operable as an electrostatic chuck as discussed above, and as will be further described below. As illustrated, electrode arrangement 500 may include a first bipolar electrode 505, and a second bipolar electrode 510. The electrodes may be embedded in a puck or chuck body as described above, such as a ceramic including aluminum nitride, and may be characterized by any of the features, configurations, or characteristics as discussed above for any substrate support. In some embodiments, the electrodes 505, 510 may be embedded between a heater 555 (shown in FIG. 5B) and a substrate support surface, however other embodiments may position the electrodes 405, 410 at other locations relative to the heater or omit the heater entirely.

First bipolar electrode 505 and second bipolar electrode 510 may each include a mesh material that may be substantially coplanar across both electrodes within the electrostatic chuck. The mesh materials may be characterized by any number of shapes or geometries. As illustrated, the first bipolar electrode 505 has a generally annular shape and extends about a generally circular second bipolar electrode 510, however other shapes such as rectangles, or any other shape may be used, which may be at least in part determined from substrate geometries, for example. The entirety of the second bipolar electrode 510 may be radially inward of the first bipolar electrode 505, and the two bipolar electrodes 505, 510 may be coaxial in some embodiments. The second bipolar electrode 510 may have a diameter of between about 5 inches and 10 inches, between about 6 inches and 9 inches, or between about 7 inches and 8 inches, although other diameters are possible in some embodiments. The first bipolar electrode 505 may have an outer diameter of between about 10 inches and 14 inches, between about 10.5 inches and 13.5 inches, between about 11 inches and 13 inches, or between 11.5 inches and 12.5 inches. The first bipolar electrode 505 and second bipolar electrode 510 may be spaced apart in a radial direction by a gap 515. The gap 515 may be between about 1 mm and 5 mm, between about 2 mm and 4 mm, or about 3 mm in some embodiments.

Electrode leads may couple one or more power sources with the mesh of each of the first bipolar electrode 505 and the second bipolar electrode 510. For example, the second bipolar electrode 510 may be coupled with one or more power sources at one or more positions 520 that may be proximate a center of the second bipolar electrode 510 or at any other position along the mesh in some embodiments. The first bipolar electrode 505 may be coupled with one or more power sources at one or more positions about the circumference of the first bipolar electrode 505. For example, as illustrated the first bipolar electrode 505 may be coupled with power sources at a number of positions 525 that are spaced at even angular intervals about the first bipolar electrode 505. In other embodiments, one or more positions 525 may be positioned at irregular intervals about the first bipolar electrode 505. The first bipolar electrode 505 may include any number of positions 525. For example, the first bipolar electrode 505 may include one or more positions, two or more positions, three or more positions, four or more positions, five or more positions, six or more positions, seven or more positions, eight or more positions, nine or more positions, ten or more positions, eleven or more positions, twelve or more positions, or more.

In some embodiments, to facilitate the coupling between the first bipolar electrode 505 and the one or more power sources, the chuck body may include a spoked connector 530 that is embedded within and/or otherwise disposed within the electrostatic chuck body. The spoked connector 530 may be similar to spoked connector 430 and may include any of the features described in relation to spoked connector 430. A power coupling may extend through a stem or shaft of the chuck body and couple with a hub of the spoked connector 530.

As illustrated, in some embodiments the arrangement 500 may include an RF electrode 560, which may be located or positioned radially outward from the first bipolar electrode 505 and the second bipolar electrode 510, and may extend about the bipolar electrodes as illustrated. The RF electrode 560 may be coaxial with one or both of the first bipolar electrode 505 and the second bipolar electrode 510. The RF electrode 560 may have a generally annular mesh having an outer periphery that extends beyond the peripheral edges of the first bipolar electrode 505 and the second bipolar electrode 510. For example, an outer diameter of the RF electrode 560 may be between about 12.5 inches and 16 inches, between about 13 inches and 15.5 inches, between about 13.5 inches and 15 inches, or between about 14 inches and 14.5 inches. In some embodiments, the mesh of the RF electrode 560 may be disposed below the meshes of the bipolar electrodes. In other embodiments, the mesh of the RF electrode 560 may be substantially coplanar with the meshes of the bipolar electrodes. In such embodiments, a diameter of an inner opening of the mesh be sized to minimize or eliminate a gap between the inner edge of the mesh of the RF electrode 560 and an outer edge of the first bipolar electrode 505. For example, the inner edge of the mesh of the RF electrode 560 may be less than 5 mm, less than 4 mm, less than 3 mm, less than 2 mm, less than 1 mm, or less from an outer edge of the first bipolar electrode 505. In some embodiments the RF electrode 560 may be included beneath the exterior region 347, for example, or may otherwise be about an edge region of the substrate support. Electrode leads may couple an RF power source with the RF electrode 560 at one or more positions 565 as illustrated. Although four such lead positions are illustrated, any number of leads may be provided in embodiments to ensure uniform delivery to the electrode. The leads may be provided at regular intervals about the RF electrode 560 to provide a symmetrical arrangement that may promote a uniform RF flow across the substrate support surface. In some embodiments, the lead connections may be provided using an additional spoked connector 570, which may have a similar structure as spoked connector 530 but extends radially outward to be aligned with the RF electrode 560. RF electrode 560 may be coupled with an RF power source, but may be DC floated (e.g., not coupled with a DC power source). By DC floating the RF electrode 560, the RF electrode 560 may help confine the DC electric potential to areas underneath the wafer, and may help reduce or eliminate the generation of DC plasma, DC discharge, and/or discoloration of the substrate support.

In some embodiments, the spoked connector 530 may be positioned below first bipolar electrode 505 and/or the second bipolar electrode 510 by a distance of between about 1 mm and 8 mm, between about 2 mm and 7 mm, between about 3 mm and 6 mm, or between about 4 mm and 5 mm. In some embodiments, the additional spoked connector 570 may be positioned below the spoked connector 530 by a distance of between about 1 mm and 8 mm, between about 2 mm and 7 mm, between about 3 mm and 6 mm, or between about 4 mm and 5 mm. In some embodiments, the heater 555 may be spaced apart (e.g., below) from the additional spoked connector 570 by between about 1 mm and 15 mm, between about 2 mm and 13 mm, between about 3 mm and 11 mm, between about 4 mm and 9 mm, or between or about 5 mm and 7 mm. Smaller distances than these ranges may result in too much RF and/or DC current leakage, while larger distances may result in needing larger/more powerful heaters, which increase costs and power usage.

Figure 5B:
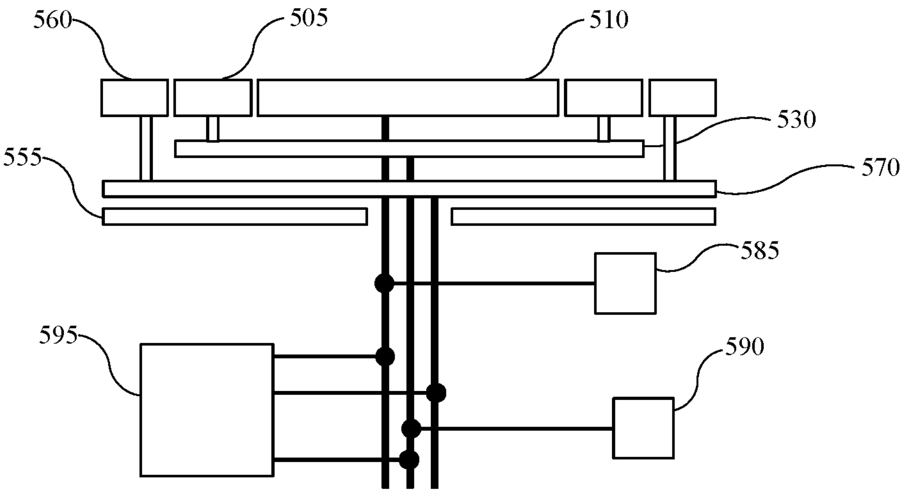
FIG. 5B shows a schematic partial cross-sectional view of an electrode arrangement for an exemplary substrate support assembly according to some embodiments of the present technology.

Each of the electrodes may be coupled with one or more power supplies as can be seen in FIG. 5B. FIG. 5B shows a schematic partial cross-sectional view of electrode arrangement 500 for an exemplary substrate support assembly according to some embodiments of the present technology. As shown, the arrangement 500 may include the first bipolar electrode 505 and second bipolar electrode 510. Each electrode may be coupled with one or more power supplies as previously described, and FIG. 5B illustrates an exemplary coupling arrangement, although it is to be understood that any number of electrode coupling configurations may be used. For example, the first bipolar electrode 505 may be coupled with a first DC power supply 585 (such as via spoked connector 530), and the second bipolar electrode 510 may be coupled with a second DC power supply 590 (such as via a DC rod or lead that extends up to the second bipolar electrode 510). Either power supply may be operated in a positive or negative voltage arrangement. Either power supply may be operated in a positive or negative voltage arrangement. This may enable the two bipolar electrodes to be operated with opposite polarities to chuck a wafer. For example, the first bipolar electrode 505 may be supplied with a negative current, while the second bipolar electrode 510 may be supplied with a positive current of equal magnitude, or vice versa. In some embodiments, the polarity of current supplied to each bipolar electrode may be switched during processing, for example, as well as increased or decreased in either direction to provide electrostatic chucking. Each power supply may be floating (ungrounded), which eliminates a relative voltage differential between the electrodes and chamber surroundings, such as chamber sidewalls. One or more RF power supplies may also be incorporated in some embodiments. For example, an RF power supply 595 may be coupled with the first bipolar electrode 505 (such as via the spoked connector 530 or another spoked connector) and the second bipolar electrode 510 (such as via an RF rod that extends up to the second bipolar electrode 510). Although a separate RF power supply may be coupled with each of the bipolar electrodes, as will be described below, in some embodiments a single power supply may be used based on the configuration of the electrodes. The RF power supply 595 (or a separate RF power source) may also be coupled with the RF electrode 560, such as via additional spoked connector 570. In some embodiments, the first bipolar electrode 505 and the second bipolar electrode 510 may have substantially (e.g., within 10%, within 5%, within 3%, within 1%, or less) the same area.

Figure 6A:
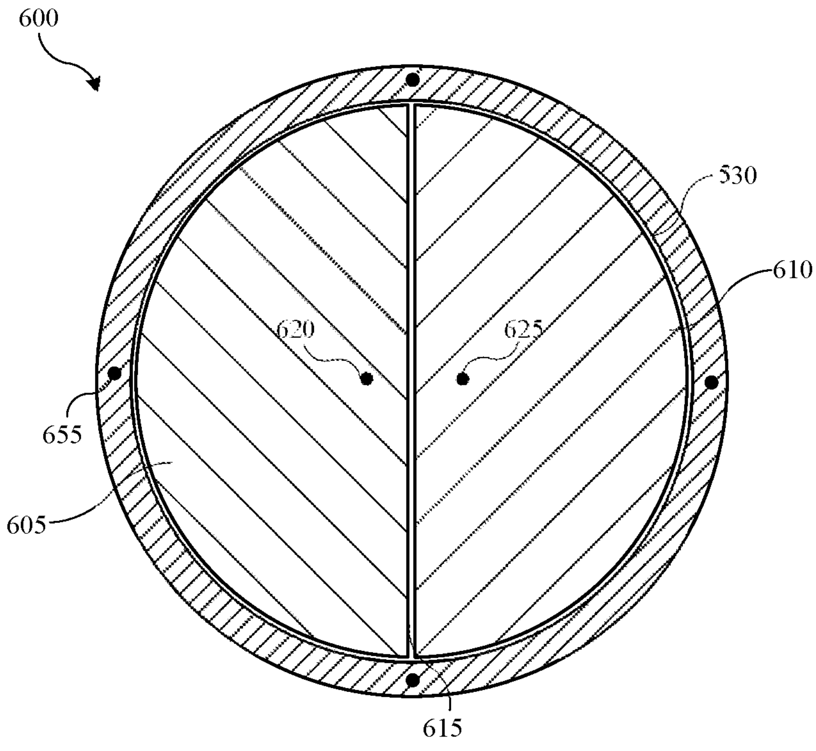
FIG. 6A shows a schematic top plan view of an electrode arrangement for an exemplary substrate support assembly according to some embodiments of the present technology.

FIG. 6A shows a schematic top view of an electrode arrangement 600 for an exemplary substrate support assembly according to some embodiments of the present technology. Arrangement 600 may include any of the features or characteristics of arrangement 400 and/or 500, and may be incorporated in any substrate support in which bipolar chucking may be used, including any substrate support previously described. For example, arrangement 600 may include a first bipolar electrode 605 and a second bipolar electrode 610. First bipolar electrode 605 and second bipolar electrode 610 may each include a mesh material that may be substantially coplanar across both electrodes within the electrostatic chuck. As illustrated, each mesh material has a semicircular shape, however other shapes may be used. Central axes of the first bipolar electrode 605 and the second bipolar electrode 610 may be radially offset from one another, with straight sides of each semicircle being parallel and adjacent one another to form a circular shape. The meshes of the first bipolar electrode 605 and the second bipolar electrode 610 may be separated by a gap 615. The meshes of each of the first bipolar electrode 605 and the second bipolar electrode 610 may have outer peripheries that are substantially aligned with an outer periphery of a substrate seat defined by the substrate support surface. For example, arced portions of each semicircular mesh may have a radius and curvature that substantially match a radius and curvature of the outer periphery of the substrate seat. Electrode leads may couple with the meshes of each of the first bipolar electrode 605, such as at position 620 and second bipolar electrode 610, such as at position 625, which may be anywhere along the mesh in some embodiments, but are oftentimes proximate a center of the substrate seat.

As illustrated, in some embodiments the arrangement 600 may include an RF electrode 660, which may be located or positioned radially outward from the first bipolar electrode 605 and the second bipolar electrode 610, and may extend about the bipolar electrodes as illustrated. For example, the RF electrode 660 may have a generally annular mesh having an outer periphery that extends beyond the peripheral edges of the first bipolar electrode 605 and the second bipolar electrode 610. In some embodiments, the mesh of the RF electrode 660 may be disposed below the meshes of the bipolar electrodes. In other embodiments, the mesh of the RF electrode 660 may be substantially coplanar with the meshes of the bipolar electrodes. In such embodiments, a diameter of an inner opening of the mesh be sized to minimize or eliminate a gap between the inner edge of the mesh of the RF electrode 660 and the arc portions of the bipolar electrodes. For example, a gap between the RF electrode 660 and the bipolar electrodes may be less than 5 mm in some embodiments. In some embodiments the RF electrode 660 may be included beneath the exterior region 347, for example, or may otherwise be about an edge region of the substrate support. Electrode leads may couple an RF power source with the RF electrode 660 at one or more positions 655 as illustrated, such as by using a spoked connector 630 (which may be similar to spoked connector 430, 530, 570, etc.). Although four such lead positions are illustrated, any number of leads may be provided in embodiments to ensure uniform delivery to the electrode. The leads may be provided at regular intervals about the RF electrode 660 to provide a symmetrical arrangement that may promote a uniform RF flow across the substrate support surface. The RF electrode 660 may be DC floated (e.g., not coupled with a DC power source). By DC floating the RF electrode 660, the RF electrode 660 may help confine the DC electric potential to areas underneath the wafer, and may help reduce or eliminate the generation of DC plasma, DC discharge, and/or discoloration of the substrate support.

Figure 6B:
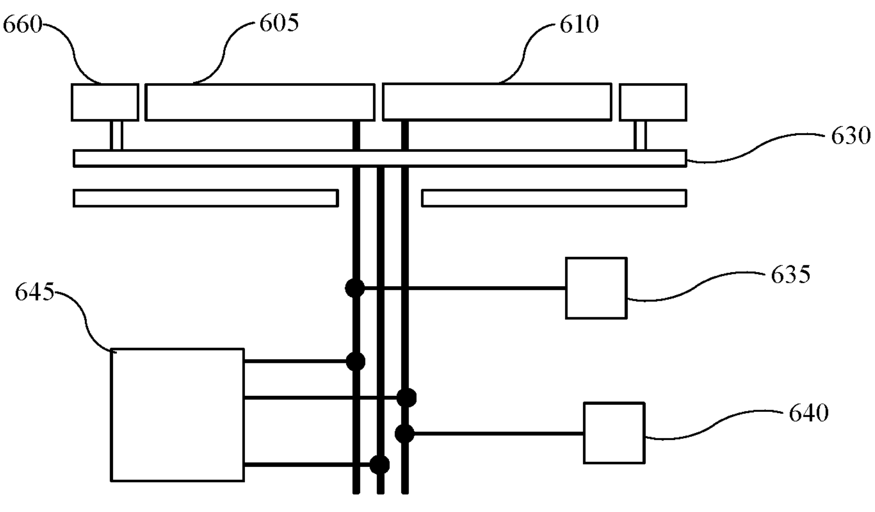
FIG. 6B shows a schematic partial cross-sectional view of an electrode arrangement for an exemplary substrate support assembly according to some embodiments of the present technology.

FIG. 6B shows a schematic partial cross-sectional view of electrode arrangement 600 for an exemplary substrate support assembly according to some embodiments of the present technology, and may include any feature, characteristic, or component as described above, and may be included in any substrate support described elsewhere. Similar to as described above, a first DC power supply 635 may be coupled with the first bipolar electrode 605, and a second DC power supply 640 may be coupled with the second bipolar electrode. The DC power supplies may be floating as previously discussed. Either power supply may be operated in a positive or negative voltage arrangement. This may enable the two bipolar electrodes to be operated with opposite polarities to chuck a wafer. For example, the first bipolar electrode 605 may be supplied with a negative current, while the second bipolar electrode 610 may be supplied with a positive current of equal magnitude, or vice versa. In some embodiments, the polarity of current supplied to each bipolar electrode may be switched during processing, for example, as well as increased or decreased in either direction to provide electrostatic chucking. Additionally, an RF power supply 645 may be coupled with the first bipolar electrode 605 and the second bipolar electrode 610, although each bipolar electrode may have a dedicated RF power supply in some embodiments. The RF power supply 645 (or a separate RF power source) may also be coupled with the RF electrode 660. Additionally, the placement of the RF electrode 660 may maintain RF continuity beyond the wafer to ensure that RF flow may be delivered more uniformly across the wafer, including edge regions of the wafer, to facilitate more uniform plasma deposition across the wafer.

Figure 7:
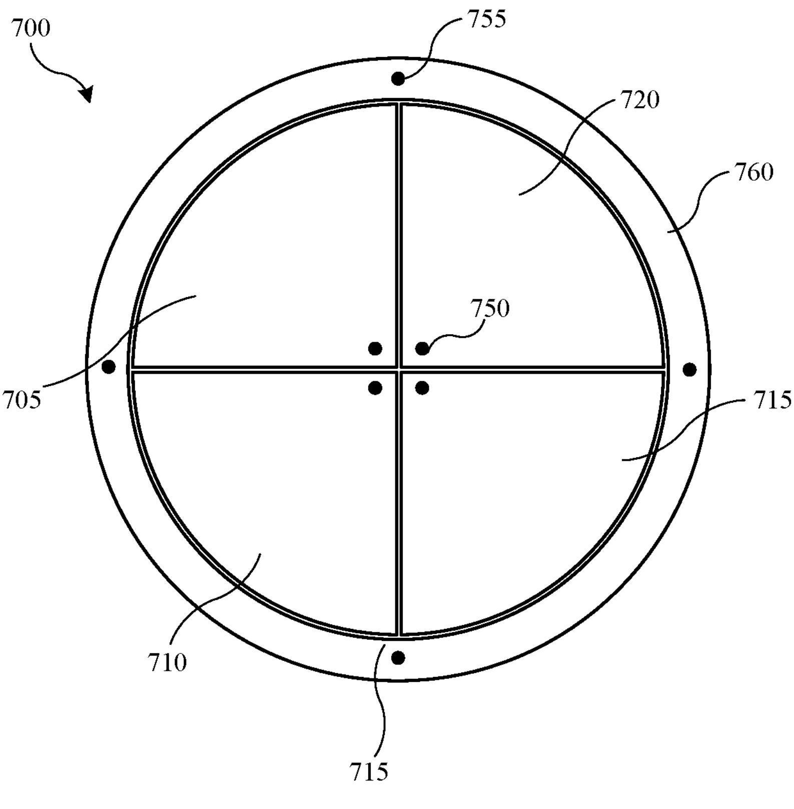
FIG. 7 shows a schematic top plan view of an electrode arrangement for an exemplary substrate support assembly according to some embodiments of the present technology.
Figure 8:
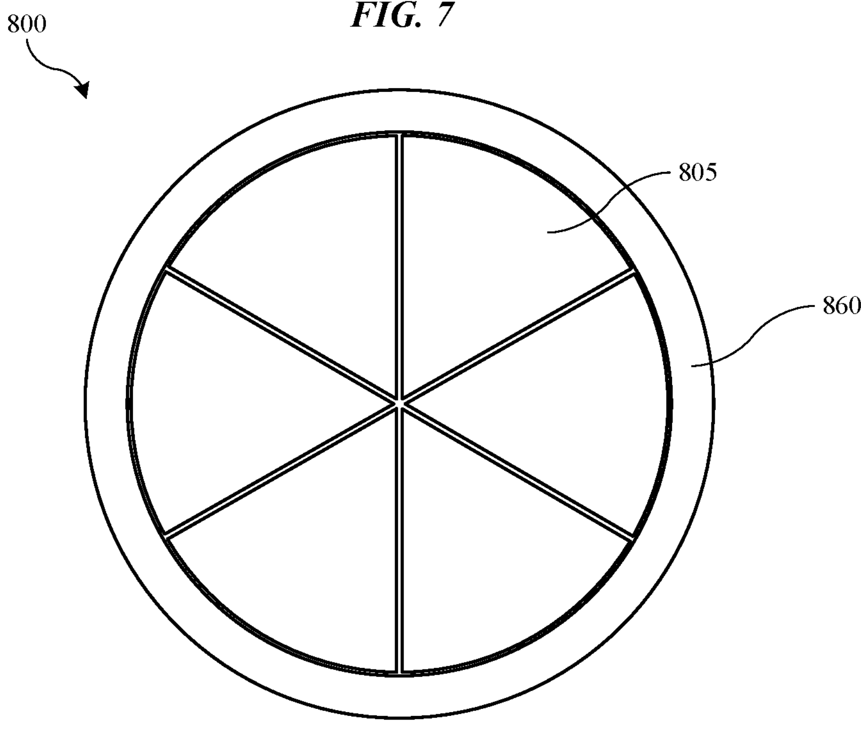
FIG. 8 shows a schematic top plan view of an electrode arrangement for an exemplary substrate support assembly according to some embodiments of the present technology.

FIG. 7 shows a schematic top view of an electrode arrangement 700 for an exemplary substrate support assembly according to some embodiments of the present technology. Arrangement 700 may include any of the features or characteristics of arrangement 400, 500, and/or 600, and may be incorporated in any substrate support in which bipolar chucking may be used, including any substrate support previously described. For example, arrangement 700 may include a first bipolar electrode 705, a second bipolar electrode 710, a third bipolar electrode 715, and a fourth bipolar electrode 720. Each bipolar electrode may include a mesh material that may be substantially coplanar across both all of the bipolar electrodes within the electrostatic chuck. Each bipolar electrode may have a wedge shape (e.g., less than 180 degrees of a circle). As illustrated, four bipolar electrodes that each have a wedge shape of 90 degrees are provided, however other sizes and numbers of bipolar electrodes may be used in various embodiments. For example, FIG. 8 illustrates an arrangement 800 with six 60 degree wedge-shaped bipolar electrodes 805. Other numbers of bipolar electrodes may be used in various embodiments. For example, the arrangement 700 may include four or more bipolar electrodes, six or more bipolar electrodes, eight or more bipolar electrodes, ten or more bipolar electrodes, or more. Oftentimes, an even number of bipolar electrodes may be used, although odd numbers may be used in various embodiments. As illustrated, each bipolar electrode has a same area, although in some embodiments some or all of the bipolar electrodes may have different sizes.

Electrode leads may couple with the meshes of each of the first bipolar electrode 705, such as at one or more positions 750, which may be proximate a center of the substrate seat but which may be anywhere along the mesh in some embodiments.

As illustrated, in some embodiments the arrangement 700 may include an RF electrode 760, which may be located or positioned radially outward from the bipolar electrodes 705, 710, 715, and 720, and may extend about the bipolar electrodes as illustrated. Similarly, arrangement 800 may include a similar RF electrode 860. The RF electrode 760 may have a generally annular mesh having an outer periphery that extends beyond the peripheral edges of the bipolar electrodes 705, 710, 715, and 720. In some embodiments, the mesh of the RF electrode 760 may be disposed below the meshes of the bipolar electrodes. In other embodiments, the mesh of the RF electrode 760 may be substantially coplanar with the meshes of the bipolar electrodes. In such embodiments, a diameter of an inner opening of the mesh be sized to minimize or eliminate a gap between the inner edge of the mesh of the RF electrode 760 and the arc portions of the bipolar electrodes. For example, a gap between the RF electrode 760 and the bipolar electrodes may be less than 5 mm in some embodiments. In some embodiments the RF electrode 760 may be included beneath the exterior region 347, for example, or may otherwise be about an edge region of the substrate support. Electrode leads may couple an RF power source with the RF electrode 760 at one or more positions 755 as illustrated, such as by using a spoked connector (which may be similar to spoked connector 430, 530, 570, 630, etc.). Although four such lead positions are illustrated, any number of leads may be provided in embodiments to ensure uniform delivery to the electrode. The leads may be provided at regular intervals about the RF electrode 760 to provide a symmetrical arrangement that may promote a uniform RF flow across the substrate support surface. The RF electrode 760 may be DC floated (e.g., not coupled with a DC power source). By DC floating the RF electrode 760, the RF electrode 760 may help confine the DC electric potential to areas underneath the wafer, and may help reduce or eliminate the generation of DC plasma, DC discharge, and/or discoloration of the substrate support.

A first DC power supply may be coupled with every odd bipolar electrode and a second DC power supply may be coupled with each even electrode. The DC power supplies may be floating as previously discussed. Either power supply may be operated in a positive or negative voltage arrangement. This may enable adjacent bipolar electrodes to be operated with opposite polarities to chuck a wafer. For example, in an alternating manner, each odd bipolar electrode (e.g., 705, 715) may be supplied with a negative current, while each even bipolar electrode (e.g., 710, 720) may be supplied with a positive current of equal magnitude, or vice versa. This enables the polarity of charge to alternate for each bipolar electrode in an azimuthal direction about the substrate support. In some embodiments, the polarity of current supplied to each bipolar electrode may be switched during processing, for example, as well as increased or decreased in either direction to provide electrostatic chucking. Additionally, an RF power supply may be coupled with the bipolar electrodes, although each bipolar electrode may have a dedicated RF power supply in some embodiments. The RF power supply (or a separate RF power source) may also be coupled with the RF electrode 760. Additionally, the placement of the RF electrode 660 may maintain RF continuity beyond the wafer to ensure that RF flow may be delivered more uniformly across the wafer, including edge regions of the wafer, to facilitate more uniform plasma deposition across the wafer.

FIG. 9 shows a schematic top view of an electrode arrangement 900 for an exemplary substrate support assembly according to some embodiments of the present technology. Arrangement 900 may include any of the features or characteristics of arrangements 400, 500, 600, 700, and/or 800, and may be incorporated in any substrate support in which bipolar chucking may be used, including any substrate support previously described. For example, arrangement 900 may include a first bipolar electrode 905 and a second bipolar electrode 910. First bipolar electrode 905 and second bipolar electrode 910 may each include a mesh material that may be substantially coplanar across both electrodes within the electrostatic chuck. As illustrated, each mesh material has a spiral shape, however other shapes may be used. Central axes of the first bipolar electrode 905 and the second bipolar electrode 910 may be coaxial or radially offset relative to one another. Each spiral shaped bipolar electrode may define a number of gaps between adjacent layers or radially outward portions of the respective spiral, with a portion of the other bipolar electrode being disposed within the gap such that the two bipolar electrodes are interdigitated relative to one another. Electrode leads may couple with the meshes of each of the first bipolar electrode 905, such as at position 920 and second bipolar electrode 910, such as at position 925, which may be anywhere along the mesh in some embodiments.

In some embodiments, a width (e.g., along each segment of the arc of the spiral) of each bipolar electrode may be the same, while in other embodiments the widths may be different. In some embodiments, a width of each bipolar electrode may be between about 20 mm and 60 mm, between about 25 mm and 55 mm, between about 30 mm and 50 mm, or between about 35 mm and 45 mm. Such widths may help ensure that the current density flowing along the length of each bipolar electrode is not sufficiently high so as to create hot spots that may lead to film uniformity issues. The width of each spiral may be constant or may vary along a length of the spiral.

As illustrated, in some embodiments the arrangement 900 may include an RF electrode 960, which may be located or positioned radially outward from the first bipolar electrode 905 and the second bipolar electrode 910, and may extend about the bipolar electrodes as illustrated. For example, the RF electrode 960 may have a generally annular mesh having an outer periphery that extends beyond the peripheral edges of the first bipolar electrode 905 and the second bipolar electrode 910. As illustrated, an inner diameter of the mesh of the RF electrode 960 may define two regions of increasing diameter that are opposed to one another. These regions may accommodate the outer portion or layer of each spiral-shaped bipolar electrode, which may continue expanding radially outward until the mesh of each bipolar electrode terminates. In some embodiments, the mesh of the RF electrode 960 may be disposed below the meshes of the bipolar electrodes. In other embodiments, the mesh of the RF electrode 960 may be substantially coplanar with the meshes of the bipolar electrodes. In such embodiments, a diameter of an inner opening of the mesh be sized to minimize or eliminate a gap between the inner edge of the mesh of the RF electrode 960 and the arc portions of the bipolar electrodes. In some embodiments the RF electrode 960 may be included beneath the exterior region 347, for example, or may otherwise be about an edge region of the substrate support. Electrode leads may couple an RF power source with the RF electrode 960 at one or more positions 965 as illustrated, such as by using a spoked connector (which may be similar to spoked connector 430, 530, 570, 630, etc.). Although two such lead positions are illustrated, any number of leads may be provided in embodiments to ensure uniform delivery to the electrode. The RF electrode 960 may be DC floated (e.g., not coupled with a DC power source). By DC floating the RF electrode 960, the RF electrode 960 may help confine the DC electric potential to areas underneath the wafer, and may help reduce or eliminate the generation of DC plasma, DC discharge, and/or discoloration of the substrate support.

Similar to as described above, a first DC power supply may be coupled with the first bipolar electrode 905, and a second DC power supply may be coupled with the second bipolar electrode. The DC power supplies may be floating as previously discussed. Either power supply may be operated in a positive or negative voltage arrangement. This may enable the two bipolar electrodes to be operated with opposite polarities to chuck a wafer. For example, the first bipolar electrode 905 may be supplied with a negative current, while the second bipolar electrode 910 may be supplied with a positive current of equal magnitude, or vice versa. In some embodiments, the polarity of current supplied to each bipolar electrode may be switched during processing, for example, as well as increased or decreased in either direction to provide electrostatic chucking. Additionally, an RF power supply may be coupled with the first bipolar electrode 905 and the second bipolar electrode 910, although each bipolar electrode may have a dedicated RF power supply in some embodiments. The RF power supply (or a separate RF power source) may also be coupled with the RF electrode 960. Additionally, the placement of the RF electrode 960 may maintain RF continuity beyond the wafer to ensure that RF flow may be delivered more uniformly across the wafer, including edge regions of the wafer, to facilitate more uniform plasma deposition across the wafer.

FIGS. 10A-10D show schematic top views of electrode arrangements 1000 for an exemplary substrate support assembly according to some embodiments of the present technology. Electrodes in arrangement 1000 may be any of the electrodes previously described, such as may be included in substrate support assembly 310, or any other number of pedestals or chucks. The bipolar electrodes may be operable as an electrostatic chuck as discussed above, and as will be further described below. As illustrated, each electrode arrangement 1000 may include a first bipolar electrode 1005 and a second bipolar electrode 1010. The bipolar electrodes may be embedded in a puck or chuck body as described above, such as a ceramic including aluminum nitride, and may be characterized by any of the features, configurations, or characteristics as discussed above for any substrate support. In some embodiments, the bipolar electrodes 1005, 1010 may be embedded between a heater (not shown) and a substrate support surface, however other embodiments may position the bipolar electrodes 1005, 1010 at other locations relative to the heater or omit the heater entirely.

First bipolar electrode 1005 and second bipolar electrode 1010 may each include a mesh material that may be substantially coplanar across both electrodes within the electrostatic chuck. The mesh materials may be characterized by any number of shapes or geometries. As illustrated, the second bipolar electrode 1010 includes a center region 1015 with multiple wedge portions 1020 extending radially outward from the center region 1015. Each wedge portion 1020 may have a width that expands in a radially outward direction to form the wedge shape. The first bipolar electrode 1005 may have a generally annular shape and may extend about the second bipolar electrode 1010.

An inner diameter of the first bipolar electrode 1005 may define a number of fingers 1025, with the fingers 1025 being sized and shaped to fit within gaps formed between adjacent ones of the wedge portions 1020. For example, each finger 1025 may have a width that tapers inward in a radially inward direction to substantially fill the respective gap. Any number of wedge portions 1020 and fingers 1025 may be provided in arrangement 1000. For example, arrangements

1000 may include two or more wedge portions 1020*a*/fingers 1025*a* (e.g., arrangement 1000*a* of FIG. 10A), three or more wedge portions 1020*b*/fingers 1025*b* (e.g., arrangement 1000*b* of FIG. 10B), four or more wedge portions 1020*c*/fingers 1025*c* (e.g., arrangement 1000*c* of FIG. 10C), five or more wedge portions/fingers, six or more wedge portions 1020*d*/fingers 1025*d* (e.g., arrangement 1000*d* of FIG. 10D), seven or more wedge portions/fingers, eight or more wedge portions/fingers, nine or more wedge portions/fingers, ten or more wedge portions/fingers, or more wedge portions/fingers. As illustrated, each wedge portion 1020 has a same area, although in some embodiments some or all of the wedge portion 1020 may have different sizes. Similarly, the fingers 1025 may each have a same area, although in some embodiments some or all of the fingers 1025 may have different sizes. In some embodiments, the first bipolar electrode 1005 and the second bipolar electrode 1010 may have substantially the same area, while in other embodiments the two bipolar electrodes may have different areas.

The entirety of the second bipolar electrode 1010 may be radially inward of the first bipolar electrode 1005, and the two bipolar electrodes 1005, 1010 may be coaxial in some embodiments. The second bipolar electrode 1010 may have a diameter of between about 7 inches and 12 inches, between about 8 inches and 11 inches, or between about 9 inches and 10 inches, although other diameters are possible in some embodiments. The first bipolar electrode 1005 may have an outer diameter of between about 12 inches and 14 inches, between about 12.25 inches and 13.75 inches, between about 12.5 inches and 13.5 inches, or between 12.75 inches and 12.25 inches. For example, the mesh the first bipolar electrode 1005 may have an outer periphery that extends radially outward beyond an outer periphery of a substrate seat (which may match an outer periphery of a substrate being processed and may be formed from a recessed region, similar to recessed region 345) defined by the substrate support surface. The first bipolar electrode 1005 and second bipolar electrode 1010 may be spaced apart by a gap of less than about 5 mm, such as between about 1 mm and 5 mm, between about 2 mm and 4 mm, or about 3 mm in some embodiments.

Electrode leads may couple one or more power sources with the mesh of each of the first bipolar electrode 1005 and the second bipolar electrode 1010. For example, the second bipolar electrode 1010 may be coupled with one or more power sources at positions 1055 that may be proximate a center of the second bipolar electrode 1010 or at any other position along the mesh in some embodiments. For example, each wedge portion may include 1020 may include a position 1055 and/or a position 1055 may be disposed within the center region 1015. The first bipolar electrode 1005 may be coupled with one or more power sources at one or more positions 1060 about the circumference and/or proximate distal ends of each of the fingers 1025 of the first bipolar electrode 405. For example, as illustrated the first bipolar electrode 1005 may be coupled with power sources at a number of positions 1055 that are positioned proximate the distal ends of the fingers 1025 (e.g., proximate a center of the support surface). In some embodiments, a number of positions for the first bipolar electrode 1005 may match a number of fingers 1025 and a number of positions for the second bipolar electrode 1010 may match a number of the wedge portions 1020.

Each of the electrodes may be coupled with one or more power supplies. For example, the first bipolar electrode 1005 may be coupled with a first DC power supply (similar to 485), and the second bipolar electrode 1010 may be coupled with a second DC power supply (similar to 490). Either power supply may be operated in a positive or negative voltage arrangement, which may be switched during processing, for example, as well as increased or decreased in either direction to provide electrostatic chucking. Each power supply may be floating (ungrounded). Either power supply may be operated in a positive or negative voltage arrangement. This may enable the two bipolar electrodes to be operated with opposite polarities to chuck a wafer. For example, the first bipolar electrode 1005 may be supplied with a negative current, while the second bipolar electrode 1010 may be supplied with a positive current of equal magnitude, or vice versa. In some embodiments, the polarity of current supplied to each bipolar electrode may be switched during processing, for example, as well as increased or decreased in either direction to provide electrostatic chucking. One or more RF power supplies may also be incorporated in some embodiments. For example, an RF power supply (such as RF power supply 495) may be coupled with the first bipolar electrode 1005 (such as via one or more RF rods) and the second bipolar electrode 1010 (such as ones or more RF rods that extend up to the second bipolar electrode 1010). Although a separate RF power supply may be coupled with each of the bipolar electrodes, in some embodiments a single power supply may be used based on the configuration of the electrodes.

FIG. 11 shows a schematic top view of an electrode arrangement 1100 for an exemplary substrate support assembly according to some embodiments of the present technology. Arrangement 1100 may be included in substrate support assembly 310, or any other number of pedestals or chucks. The bipolar electrodes may be operable as an electrostatic chuck as discussed above, and as will be further described below. As illustrated, each bipolar electrode arrangement 1100 may include a first bipolar electrode 1105, and a second bipolar electrode 1110. The bipolar electrodes may be embedded in a puck or chuck body as described above, such as a ceramic including aluminum nitride, and may be characterized by any of the features, configurations, or characteristics as discussed above for any substrate support. In some embodiments, the electrodes 1105, 1110 may be embedded between a heater (not shown) and a substrate support surface, however other embodiments may position the electrodes 1105, 1110 at other locations relative to the heater or omit the heater entirely.

First bipolar electrode 1105 and second bipolar electrode 1110 may each include a mesh material that may be substantially coplanar across both electrodes within the electrostatic chuck. The mesh materials may be characterized by any number of shapes or geometries. As illustrated, the first bipolar electrode 1105 includes an outer portion 1120 and an inner portion 1125 that are coupled via a neck 1130. In some embodiments, the outer portion 1120 may be generally annular in shape, while the inner portion 1125 may be generally C-shaped (e.g., an arc with an open end). In some embodiments, the first bipolar electrode 1105 may include an innermost portion 1135 that is coupled with the inner portion 1125 via an additional neck 1160. The innermost portion 1135, if present, may be generally C-shaped as illustrated, but may have different shapes in various embodiments. The second bipolar electrode 1110 may include an outer portion 1145 and an inner portion 1150 that are coupled via a neck 1155. Each of the outer portion 1145 and the inner portion 1150 may be generally C-shaped and may face an opposite direction as the C-shapes of the inner portion 1125 and/or innermost portion 1135. This may enable the outer portion 1145 and inner portion 1150 of the second bipolar electrode 1110 to be interdigitated with the outer portion 1120, inner portion 1125, and/or innermost portion 1135 of the first bipolar electrode 1105, with each neck 1130, 1160, 1155 being disposed between opposing ends of a respective C-shaped portion of the other bipolar electrode. Each C-shaped portion may at least partially fill a center of a portion of the other bipolar electrode. In other words, each of the first bipolar electrode 1105 and the second bipolar electrode 1110 may define one or more gaps between different portions of the respective bipolar electrode, and a portion of the other bipolar electrode may extend into and/or substantially fill each gap such that the two bipolar electrodes cover substantially all of the area of the substrate support seat. In some embodiments, the first bipolar electrode 1105 and the second bipolar electrode 1110 may have substantially the same area, while in other embodiments the two bipolar electrodes may have different areas. In some embodiments, a width of each neck of the first bipolar electrode 1105 and the second bipolar electrode 1110 may be at least 1.5× a width a smaller of the inner portion 1125 and the outer portion 1120, at least 1.75×, at least 2×, at least 2.25×, at least 2.5×, or more. For example, in some embodiments, each neck may have a width of between about 35 mm and 100 mm, between about 40 mm and 95 mm, between about 45 mm and 90 mm, between about 50 mm and 85 mm, between about 55 mm and 80 mm, between about 60 mm and 75 mm, or between about 65 mm and 70 mm. Such widths may help ensure that there is sufficient electrode material to handle the current flowing through the necks without creating resistive heating hot spots that may impact the film uniformity on wafer.

The entirety of the second bipolar electrode 1110 may be radially inward of the first bipolar electrode 1105. In other words, at least a portion of the first bipolar electrode 1105 may fully surround the second bipolar electrode 1110. The two bipolar electrodes 1105, 1110 may be coaxial or have central axes that are offset relative to another in some embodiments. The second bipolar electrode 1110 may have an outer diameter of between about 7 inches and 12 inches, between about 8 inches and 11 inches, or between about 9 inches and 10 inches, although other diameters are possible in some embodiments. The first bipolar electrode 1105 may have an outer diameter of between about 12 inches and 14 inches, between about 12.25 inches and 13.75 inches, between about 12.5 inches and 13.5 inches, or between 12.75 inches and 12.25 inches. For example, the mesh of the first bipolar electrode 1105 may have an outer periphery that extends radially outward beyond an outer periphery of a substrate seat (which may match an outer periphery of a substrate being processed and may be formed from a recessed region, similar to recessed region 345) defined by the substrate support surface. The first bipolar electrode 1105 and second bipolar electrode 1110 may be spaced apart by a gap of between about 1 mm and 5 mm, between about 2 mm and 4 mm, or about 3 mm in some embodiments.

Electrode leads may couple one or more power sources with the mesh of each of the first bipolar electrode 1105 and the second bipolar electrode 1110. For example, the second bipolar electrode 1110 may be coupled with one or more power sources at one or more positions 1140 that may be proximate a center of the second bipolar electrode 1110 or at any other position along the mesh in some embodiments. The first bipolar electrode 1105 may be coupled with one or more power sources at one or more positions 1165 proximate the center of the substrate seat and/or about the circumference of the first bipolar electrode 1105. For example, as illustrated the first bipolar electrode 1105 may be coupled with power sources at a number of positions 1165 that are spaced at even angular intervals about the first bipolar electrode 1105, such as by using a spoked connector (which may be similar to spoked connector 430, 530, 570, 630, 730, etc.). In other embodiments, one or more positions 1165 may be positioned at irregular intervals about the first bipolar electrode 1105. The first bipolar electrode 1105 may include any number of positions 1165. For example, the first bipolar electrode 1105 may include one or more positions, two or more positions, three or more positions, four or more positions, five or more positions, six or more positions, seven or more positions, eight or more positions, nine or more positions, ten or more positions, eleven or more positions, twelve or more positions, or more.

Each of the electrodes may be coupled with one or more power supplies. For example, the first bipolar electrode 1105 may be coupled with a first DC power supply (similar to 485), and the second bipolar electrode 1110 may be coupled with a second DC power supply (similar to 490). Either power supply may be operated in a positive or negative voltage arrangement, which may be switched during processing, for example, as well as increased or decreased in either direction to provide electrostatic chucking. Each power supply may be floating (ungrounded). Either power supply may be operated in a positive or negative voltage arrangement. This may enable the two bipolar electrodes to be operated with opposite polarities to chuck a wafer. For example, the first bipolar electrode 1105 may be supplied with a negative current, while the second bipolar electrode 1110 may be supplied with a positive current of equal magnitude, or vice versa. In some embodiments, the polarity of current supplied to each bipolar electrode may be switched during processing, for example, as well as increased or decreased in either direction to provide electrostatic chucking. One or more RF power supplies may also be incorporated in some embodiments. For example, an RF power supply (such as RF power supply 495) may be coupled with the first bipolar electrode 1105 (such as via one or more RF rods) and the second bipolar electrode 1110 (such as ones or more RF rods that extend up to the second bipolar electrode 1110). Although a separate RF power supply may be coupled with each of the bipolar electrodes, in some embodiments a single power supply may be used based on the configuration of the electrodes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a heater” includes a plurality of such heaters, and reference to “the mesh” includes reference to one or more meshes and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:

an electrostatic chuck body defining a substrate support surface that defines a substrate seat;

a support stem coupled with the electrostatic chuck body;

a first bipolar electrode embedded within the electrostatic chuck body;

a second bipolar electrode embedded within the electrostatic chuck body, wherein:

an entirety of the second bipolar electrode is radially inward of at least a portion of the first bipolar electrode;

the first bipolar electrode and the second bipolar electrode are coaxial with one another;

each of the first bipolar electrode and the second bipolar electrode is coupled with at least one RF power supply;

each of the first bipolar electrode and the second bipolar electrode is coupled with at least one DC power supply; and the first bipolar electrode and the second bipolar electrode have substantially the same area; and an annular electrode disposed about the first bipolar electrode, wherein the annular electrode is DC floated and RF powered.

2. The substrate support assembly of claim 1, further comprising:

a spoked connector disposed within the electrostatic chuck body, the spoked connector coupling the annular electrode with an RF power supply.

3. The substrate support assembly of claim 2, wherein:

individual spokes of the spoked connector have a width of at least 5 mm.

4. The substrate support assembly of claim 1, wherein:

the first electrode comprises a generally annular shape; and the second electrode comprises a generally circular shape.

5. The substrate support assembly of claim 4, wherein:

the annular electrode is coaxial with the first bipolar electrode.

6. The substrate support assembly of claim 1, wherein:

the second electrode comprises a first portion and a second portion that are coupled with one another and separated by a gap; and a portion of first electrode extends into the gap formed between the first portion and the second portion.

7. A substrate support assembly, comprising:

an electrostatic chuck body defining a substrate support surface that defines a substrate seat;

a support stem coupled with the electrostatic chuck body;

a first bipolar electrode embedded within the electrostatic chuck body;

a second bipolar electrode embedded within the electrostatic chuck body, wherein:

the second electrode comprises a first portion and a second portion that are coupled with one another and separated by a gap;

a portion of first electrode extends into the gap formed between the first portion and the second portion;

each of the first bipolar electrode and the second bipolar electrode is coupled with at least one RF power supply; and each of the first bipolar electrode and the second bipolar electrode is coupled with at least one DC power supply, and wherein the first bipolar electrode and the second bipolar electrode have substantially the same area.

8. The substrate support assembly of claim 7, wherein:

an entirety of the second bipolar electrode is radially inward of at least a portion of the first bipolar electrode.

9. The substrate support assembly of claim 7, further comprising:

an annular electrode disposed about the first bipolar electrode and the second bipolar electrode, wherein the annular electrode is DC floated and RF powered.

10. The substrate support assembly of claim 7, wherein:

the first bipolar electrode comprises a first outer portion and a first inner portion that are coupled via a first neck;

the second bipolar electrode comprises a second outer portion and a second inner portion that are coupled via a second neck; and the second outer portion is interdigitated between the first outer portion and the first inner portion.

11. The substrate support assembly of claim 10, wherein:

a thickness of each of the first neck and the second neck is at least 1.5× a width a smaller of the first inner portion and the first outer portion.

12. The substrate support assembly of claim 7, wherein:

each of the first bipolar electrode and the second bipolar electrode comprises a spiral shape.

13. The substrate support assembly of claim 12, wherein:

a width of each segment of the spiral shape is at least 20 mm.

* * * * *